US011423191B2

(12) United States Patent
Stoddart et al.

(10) Patent No.: US 11,423,191 B2
(45) Date of Patent: Aug. 23, 2022

(54) AUTOMATED GENERATION AND EVALUATION OF ARCHITECTURAL DESIGNS

(71) Applicant: AUTODESK, INC., San Rafael, CA (US)

(72) Inventors: James Stoddart, New York, NY (US); Danil Nagy, New York, NY (US); David Benjamin, New York, NY (US); Lorenzo Villaggi, New York, NY (US)

(73) Assignee: AUTODESK, INC., San Rafael, CA (US)

( * ) Notice: Subject to any disclaimer, the term of this patent is extended or adjusted under 35 U.S.C. 154(b) by 754 days.

(21) Appl. No.: 16/112,562

(22) Filed: Aug. 24, 2018

(65) Prior Publication Data

US 2019/0065633 A1 Feb. 28, 2019

Related U.S. Application Data

(60) Provisional application No. 62/553,053, filed on Aug. 31, 2017.

(51) Int. Cl.
*G06F 30/13* (2020.01)

(52) U.S. Cl.
CPC .................. *G06F 30/13* (2020.01)

(58) Field of Classification Search
CPC ....................................... G06F 30/13
See application file for complete search history.

(56) References Cited

U.S. PATENT DOCUMENTS

2009/0160856 A1\* 6/2009 Hoguet .............. G06T 17/00 345/420
2014/0200861 A1\* 7/2014 DeVito .............. G06F 30/13 703/1

OTHER PUBLICATIONS

Michalek, Jeremy, Ruchi Choudhary, and Panos Papalambros. "Architectural layout design optimization." Engineering optimization 34.5 (2002): 461-484.\*
Lin, Borong, et al. "Research on parametric design method for energy efficiency of green building in architectural scheme phase." Frontiers of Architectural Research 2.1 (2013): 11-22.\*
Konnikova, Maria, "The Open Office Trap", The New Yorker, http://www.newyorker.com/business/currency/the-open-office-trap, Jan. 7, 2014, 6 pages.
Naber et al., "Workspaces that Move People", Harvard Business Review, vol. 92, No. 10, Oct. 2014, pp. 68-77.
Pentland, Alex, "The New Science of Building Great Teams", Harvard Business Review, vol. 90, No. 4, Apr. 2012, pp. 60-69.
Kim et al., "Workspace satisfaction: The privacy-communication trade-off in open-plan offices", Journal of Environmental Psychology, vol. 36, http://dx.doi.org/10.1016/j.jenvp.2013.06.007, 2013, pp. 18-26.

(Continued)

*Primary Examiner* — Bijan Mapar
(74) *Attorney, Agent, or Firm* — Artegis Law Group, LLP

(57) ABSTRACT

A design engine is configured to interact with potential occupants of a structure in order to generate data that defines the usage preferences of those occupants. The design engine generates multiple candidate designs for the structure via a generative design process, and then evaluates each candidate design using a set of metrics determined relative to the usage preferences. Based on these evaluations, the design engine selects at least one candidate design that optimizes the set of metrics across all potential occupants.

20 Claims, 8 Drawing Sheets

(56) References Cited

OTHER PUBLICATIONS

Gensler: US Workplace Survey 2016, https://www.gensler.com/research-insight/workplace-surveys/US/2016, 2016, 5 pages.
Brennan et al., "Traditional Versus Open Office Design: A Longitudinal Field Study", Environment and Behavior, vol. 34, No. 3, May 3, 2002, pp. 279-299.
Haynes, Barry P., "Office productivity: a shift from cost reduction to human contribution", Facilities, vol. 25, No. 11/12, 2007, pp. 452-462.
Calixto et al., A literature review for space planning optimization using an evolutionary algorithm approach 1992-2014, Blucher Design Proceedings, vol. 2, No. 3, 2015, pp. 662-671.
Krejcirik, M., "Computer-aided plant layout", Computer-Aided Design, vol. 2, No. 1, 1969, pp. 7-19.
Muther et al., "Systematic Layout Planning", MIRP books, Fourth Edition, Chapter 5, 2015, 30 pages.
Krarup et al., "Computer-Aided Layout Design", Mathematical programming in use, 1978, pp. 75-94.
Liggett, Robin S., "Automated facilities layout: past, present and future", Automation in construction, vol. 9, No. 2, 2000, pp. 197-215.
Arvin et al., "Modeling architectural design objectives in physically based space planning", Automation in Construction, vol. 11, No. 2, 2002, pp. 213-225.
Helme et al., "Spatial configuration: Semi-automatic methods for layout generation in practice", The Journal of Space Syntax, vol. 5, No. 1, 2014, pp. 35-49.
Haynes, Barry Philip, "Workplace connectivity: A study of its impact on self-assessed productivity", European Real Estate Society (ERES), No. eres 2007-297, 2007, 390 pages.
Stallworth Jr. et al., "Recent developments in office design", Facilities, vol. 14, No. 1/2, Jan./Feb. 1996, pp. 34-42.
Leblebici, Demet, "Impact of Workplace Quality On Employee's Productivity:Case Study of a Bank in Turkey", Journal of Business Economics and Finance, vol. 1, No. 1, 2012, pp. 38-49.
Haynes, Barry P., "The impact of office layout on productivity", Journal of facilities Management, vol. 6, No. 3, 2008, pp. 189-201.
Leaman et al., "Building Design, Complexity and Manageability", Facilities, vol. 11, No. 9, 1993, pp. 16-27.
Haynes, Barry P., "An evaluation of office productivity measurement", Journal of Corporate Real Estate, vol. 9, No. 3, 2007, pp. 144-155.
Mak et al., "The effect of sound on office productivity", Building Services Engineering Research and Technology, vol. 33, No. 3, 2012, pp. 339-345.
Mawson, Andrew, "The Workplace and its Impact on Productivity", Advanced Workplace Associates, London, 2002, 11 pages.
Oldham et al., "Employee Reactions to Workspace Characteristics", Journal of Applied Psychology, vol. 72, No. 1, 1987, pp. 75-80.
Clements-Croome et al., "Productivity and Indoor Environment", In Proceedings of Healthy Buildings, vol. 1, 2000, pp. 629-634.
An et al., "Why We Need More Nature at Work: Effects of Natural Elements and Sunlight on Employee Mental Health and Work Attitudes", PLoS one, vol. 11, No. 5, p. e0155614, doi:10.1371/journal.pone.0155614, May 23, 2016, pp. 1-17.
Mahbob et al., A correlation studies of Indoor Environmental Quality(IEQ) towards productive workplace. In 2nd International Conference on Environmental Science and Technology (2011), 5 pages.
Veitch et al., "Lighting for high-quality workplaces", Creating the productive workplace, vol. 3, No. 13, 2006, pp. 206-222.
Wilkins, Arnold J., "Health and Efficiency in Lighting Practice", Energy, vol. 18, No. 2, 1993, pp. 123-129.
Kim et al., "Are Windows and Views Really Better? A Quantitative Analysis of the Economic and Psychological Value of Views", New York (NY): Lighting Research Center, Rensselaer Polytechnic Institute, Jan. 2005, pp. 1-32.
Menzies et al., "Windows in the workplace: examining issues of environmental sustainability and occupant comfort in he selection of multi-glazed windows", Energy and Buildings, vol. 37, No. 6, doi:10.1016/j.enbuild.2004.09.012, Sep. 18, 2004, pp. 623-630.
Deb et al., "A Fast and Elitist Multiobjective Genetic Algorithm : NSGA-II", IEEE transactions on evolutionary computation. vol. 6, No. 2, Apr. 2002, pp. 182-197.

* cited by examiner

AUTOMATED GENERATION AND EVALUATION OF ARCHITECTURAL DESIGNS

CROSS-REFERENCE TO RELATED APPLICATIONS

This application claims the priority benefit of United States provisional patent application titled, "Simulation of User Satisfaction for Generative Design in Architecture," filed on Aug. 31, 2017 and having Ser. No. 62/553,053. The subject matter of this related application is hereby incorporated herein by reference.

BACKGROUND

Field of the Various Embodiments

Embodiments of the present invention relate generally to architectural design applications and design generation and, more specifically, to automated generation and evaluation of architectural designs.

Description of the Related Art

In a conventional engineering design process, a designer initially defines a set of design criteria associated with a design problem and then generates several candidate designs that meet those design criteria to varying degrees. The designer then evaluates the candidate designs based on the design criteria and identifies a candidate design that best meets or optimizes the set of design criteria. A given design criterion can usually be expressed via a mathematical function. For example, a given design criterion could indicate that the strength-to-weight ratio of a given design should be minimized. Accordingly, designers can evaluate candidate designs in an objective manner by computing mathematical functions associated with the design criteria and then evaluating those functions for each candidate design.

The above process can be applied effectively to a variety of different engineering problems. However, the above process is not particularly suitable for evaluating architectural designs of spaces and/or structures that are intended to be used by groups of occupants. More particularly, the design of a given space or structure typically depends on the subjective needs of the potential occupants of that space or structure. Those subjective needs cannot be quantified easily via mathematical functions. For example, a group of potential occupants could desire a structure that cultivates a sense of community. However, developing a function that measures the degree to which a candidate design cultivates a sense of community is difficult, if not impossible, because subjective needs and feeling are not quantifiable. Because of the difficulties associated with quantifying subjective needs and feelings, designers typically rely on experience and/or intuition when evaluating candidate designs for architectural design projects.

One significant problem with relying on experience and/or intuition when evaluating candidate architectural designs is that a designer cannot deterministically quantify the degree to which a given candidate design meets the needs of a potential occupant. Consequently, designers end up generating candidate designs that do not fully address all of the needs of the potential occupants or fail to address one or more particular needs altogether.

As the foregoing illustrates, what is needed in the art are more effective approaches to generating and evaluating candidate designs in an architectural design process.

SUMMARY

Various embodiments include a computer-implemented method for generating an architectural design for a structure, including generating preference data that indicates a set of preferences associated with a first potential occupant of the structure, wherein the preference data indicates at least one numerical value corresponding to a first attribute of the structure, generating a plurality of candidate designs for the structure via a generative design process, wherein each candidate design included in the plurality of candidate designs satisfies each design criterion included in a set of design criteria, generating a first set of metrics for a first candidate design included in the plurality of candidate designs based on the preference data and one or more geometrical analyses of the first candidate design, generating a fitness metric for the first candidate design based on the first set of metrics, wherein the fitness metric indicates that the first candidate design meets the set of preferences to a greater degree than any other candidate design included in the plurality of candidate designs.

At least one advantage of the disclosed techniques is that candidate designs for structures can be automatically and objectively evaluated to determine specific designs which address the needs of potential occupants of the structure

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

As noted above, a designer typically relies on experience and intuition when generating and evaluating candidate designs for a structure. However, this approach is entirely subjective, and so there is no way to determine the degree to which any given candidate design is expected to meet the needs of potential occupants of the structure. Consequently, designs generated via a conventional architectural design process oftentimes do not fully address the needs of the potential occupants.

To address this issue, embodiments of the invention include a design engine configured to interact with potential occupants of a structure in order to generate data that defines the usage preferences of those occupants. The design engine generates multiple candidate designs for the structure via a generative design process, and then evaluates each candidate design using a set of metrics determined relative to the usage preferences. Based on these evaluations, the design engine selects at least one candidate design that optimizes the set of metrics across all potential occupants.

At least one advantage of the disclosed approach is that candidate designs for structures can be automatically and objectively evaluated to determine specific designs which address the needs of potential occupants of the structure. Accordingly, the disclosed approach represents an advancement over prior art techniques that provide no objective metrics for selecting candidate designs.

System Overview

Figure 1:
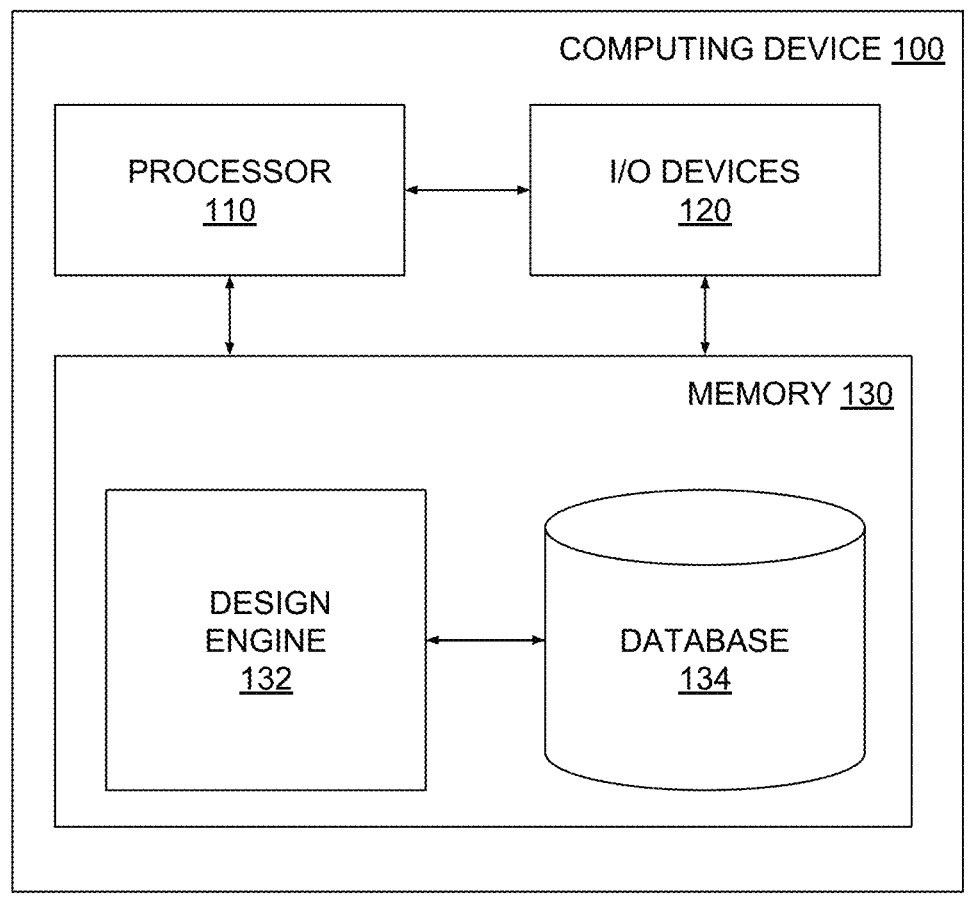
FIG. 1 illustrates a computing device configured to implement one or more aspects of the various embodiments of the present invention.

FIG. 1 illustrates a computing device configured to implement one or more aspects of the various embodiments of the present invention. As shown, a computing device 100 includes a processor 110, input/output (I/O) devices 120, and memory 130, coupled together.

Processor 110 includes any technically feasible set of hardware units configured to process data and execute software applications. For example, processor 110 could include one or more central processing units (CPUs). I/O devices 120 include any technically feasible set of devices configured to perform input and/or output operations, including, for example, a display device, a keyboard, and a touchscreen, among others. Memory 130 includes any technically feasible storage media configured to store data and software applications, such as, for example, a hard disk, a random-access memory (RAM) module, and a read-only memory (ROM). Memory 130 includes a design engine 132 and a database 134, coupled together.

Design engine 132 is a software application including program code that, when executed by processor 110, generates and evaluates candidate designs for a structure. A given candidate design includes a geometrical model of the structure that delineates how physical space within the structure is organized for use by potential occupants. Design engine 132 generates candidate designs via a generative design process that is performed based on various design criteria, including design objectives and design constraints. The generative design process could involve, for example, the execution of a multi-objective solver, topology generation algorithm, or other geometrical construction process.

Design engine 132 evaluates each candidate design based on preference data associated with the potential occupants of the structure in conjunction with a set of metrics generated for each candidate design. Design engine 132 generates the preference data via interactions with the potential occupants of the structure, as described in greater detail below in conjunction with FIG. 2. In so doing, design engine 132 implements a sequence of increasingly specific surveys that characterize and quantify how the potential occupants intend to use the structure. Design engine 132 generates the set of metrics for a given candidate design based on the preference data and using various geometrical analyses that are described in greater detail below in conjunction with FIGS. 3-7. The set of metrics for a given candidate design indicate how closely that design aligns with the preferences of the potential occupants.

At least one advantage of the approach described above is that candidate designs for a structure are evaluated objectively through a deterministic process that occurs based on quantified preferences of potential occupants of the structure. Accordingly, design options can be identified within the candidate designs which address the needs of those potential occupants. This approach confers an advantage over conventional architectural design processes that occur based on the subjective experience and intuition of a designer.

Figure 2:
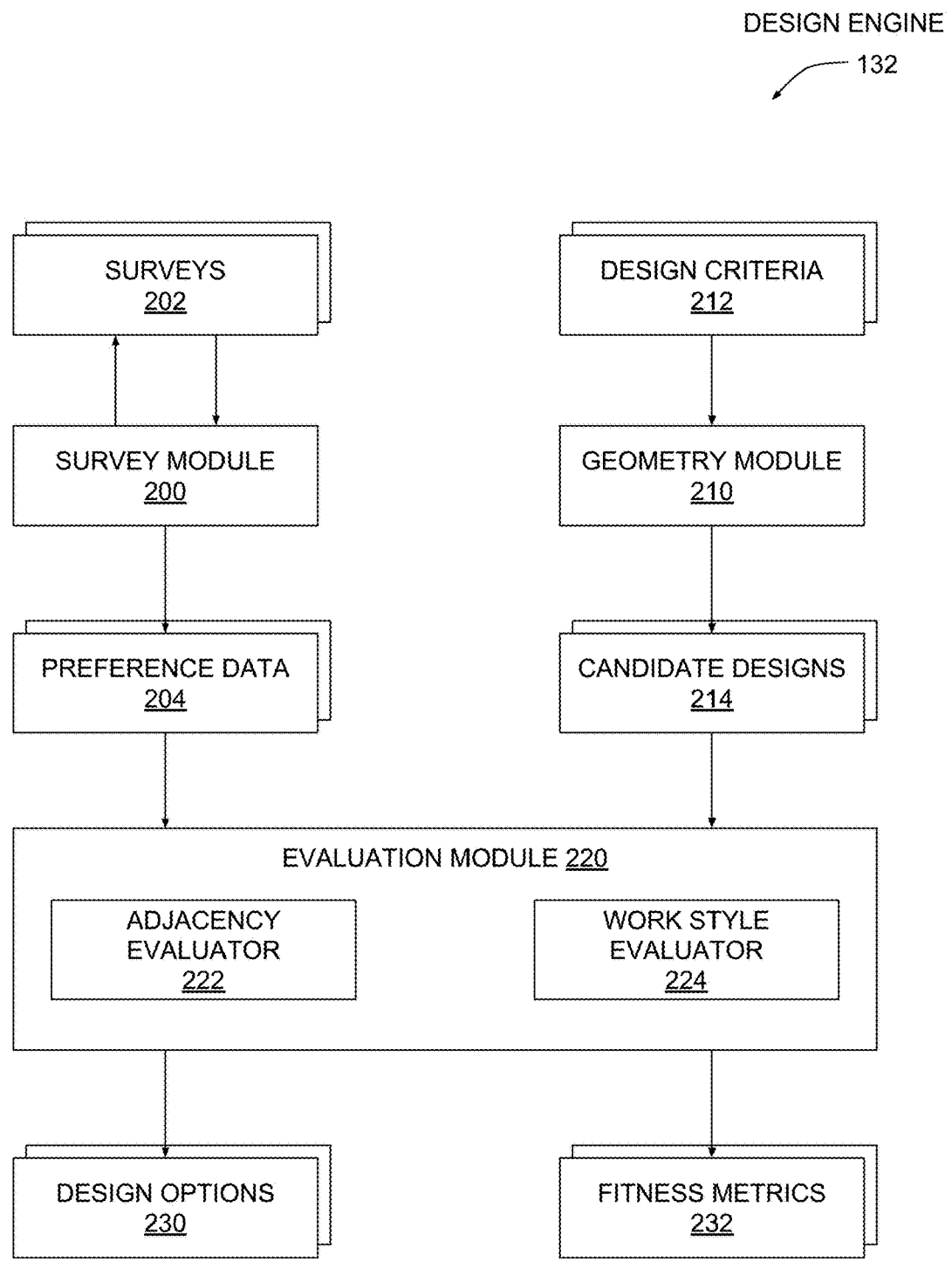
FIG. 2 is a more detailed illustration of the design engine of FIG. 1, according to various embodiments of the present invention.

FIG. 2 is a more detailed illustration of the design engine of FIG. 1, according to various embodiments of the present invention. As shown, design engine 132 includes a survey module 200, a geometry module 210, and an evaluation module 220.

Survey module 200 is a software module configured to capture data from potential occupants of the structure being designed. Survey module 200 generates surveys 202 that include different queries to be presented to potential occupants. These queries generally relate to the adjacency preferences and work style preferences of potential occupants. As discussed in greater detail below, the "adjacency preference" of a potential occupant corresponds to a desired proximity of the potential occupant to other occupants and/or other elements of a workspace. The "work style preference" of a potential occupant relates to a desired working environment of the potential occupant. Survey module 200 generates a graphical user interface (GUI) that presents surveys 202 to potential occupants. In one embodiment, survey module 200 deploys surveys via a web-based portal.

A given survey 202 can include a specific set of queries that is derived from responses to previous survey queries, allowing sequential surveys to capture increasingly specific data. For example, an initial survey could ask a potential occupant to rank the importance of proximity to others compared to the importance of privacy. If the potential occupant ranks proximity to others above privacy, then survey module 200 could generate a subsequent survey which asks the potential occupant to select, on a scale of 1 to 5, a desired proximity to others. In this manner, survey engine 200 obtains data having a range of granularities that initially reflects higher-level preferences and then subsequently reflects quantified preferences. Survey engine 200 generates preference data 204 based on responses to all surveys presented to potential occupants and transmits this data to evaluation module 220.

Independently of the surveying process described above, geometry module 210 analyzes design criteria 212 and generates a plurality of candidate designs 214 that at least partially meet those criteria. A given design criterion is either a design constraint or a design objective. An exemplary design constraint could be that any candidate design must have at least a minimum area. An exemplary design objective could be that any candidate design should maximize the amount of floorspace devoted to desks. Design criteria 212 can include any technically feasible design constraints and/or design criteria.

Geometry module 210 implements a generative design process to generate candidate designs 214. Each candidate design includes geometry for a potential layout of the structure as well as a distribution of various fixtures within that geometry. Those fixtures could include, for example, amenities, desks, walls, staircases, doors, and other features typically associated with structures. Any technically feasible approach can be applied to generate candidate designs, although in operation geometry module 210 sequentially applies a set of geometry construction rules using varying sets of parameters to produce different candidate designs. Geometry module 210 transmits these candidate designs to evaluation module 220.

Evaluation module 220 is a software module that evaluates candidate designs 214 to identify those candidate designs which most closely align with the adjacency and work style preferences of potential occupants, as indicated in preference data 204. Evaluation module 220 includes an adjacency evaluator 222 and a workstyle evaluator 224.

Adjacency evaluator 222 analyzes the geometry of candidate designs 214 based on adjacency preferences indicated in preference data 204. For a given candidate design 214 and given preference data 204 corresponding to a potential occupant, adjacency evaluator 222 generates an adjacency metric for that candidate design 214. The adjacency metric indicates the degree to which the given candidate design 214 provides the adjacency level preferred by the potential occupant. Adjacency evaluator 222 generates an adjacency metric for each potential occupant and then combines these metrics to produce an overall adjacency metric for the candidate design. Adjacency evaluator 222 performs this process for each candidate design 214. An example of how adjacency evaluator 222 computes the adjacency metric for a given candidate design 214 is described in greater detail below in conjunction with FIG. 3.

Workstyle evaluator 224 analyzes the geometry of candidate designs 214 based on work style preferences indicated in preference data 204. For a given candidate design 214 and given preference data 204 corresponding to a potential occupant, work style evaluator 224 generates a work style metric for that candidate design 214. The work style metric indicates the degree to which the given candidate design 214 provides the type of working environment preferred by the potential occupant. The work style metric is computed based on a preferred exposure to other occupants, a preferred exposure to foot traffic, a preferred lighting level, and a preferred exposure to outside views. Work style evaluator 224 generates a work style metric for each potential occupant and then combines these metrics to produce an overall work style metric for the candidate design 214. Work style evaluator 224 performs this process for each candidate design 214. An example of how work style evaluator 224 computes the work style metric for a given candidate design 214 is described in greater detail below in conjunction with FIG. 4-7.

Evaluation module 220 implements adjacency evaluator 222 and work style evaluator 224 in the manner described above to generate adjacency and work style metrics corresponding to each candidate design 214 and for each potential occupant. For any given candidate design 214, evaluation module 220 combines the adjacency and work style metrics to generate a unified fitness metric, thereby generating fitness metrics for all candidate designs 214. Evaluation module 220 then filters candidate designs 214 based on the associated fitness metrics to identify candidate designs 214 which best address the preferences of all potential occupants. Evaluation module outputs these identified designs as deign options 230 along with corresponding fitness metrics 232.

Referring generally to FIGS. 1-2, according to the disclosed techniques, design engine 132 generates and evaluates numerous candidate designs 214 but only selects those which best meet the preferences of all potential occupants. These selected candidate designs are considered design options. This approach is especially useful when considering multiple competing design objectives, as is often the case in architectural design. The computation of adjacency metrics and work style metrics is described by way of example below in conjunction with FIG. 3 and FIGS. 4-7, respectively.

Exemplary Computation of an Adjacency Metric

Figure 3:
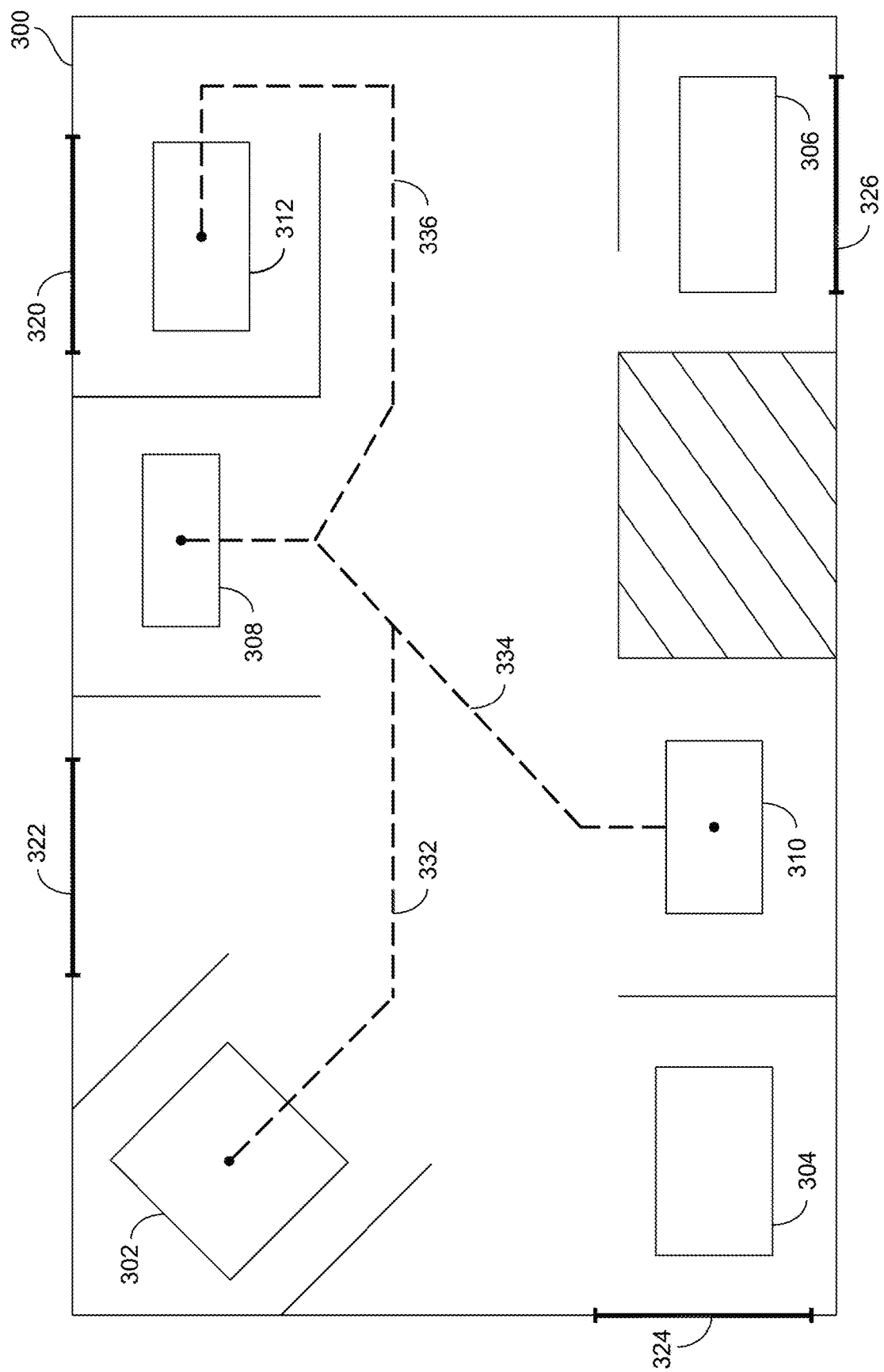
FIG. 3 illustrates how an adjacency metric is computed for a candidate design, according to various embodiments of the present invention.

FIG. 3 illustrates how an adjacency metric is computed for a candidate design, according to various embodiments of the present invention. As shown, a candidate design 300 includes a plurality of fixtures 302, 304, 306, 308, 310, and 312, as well as a plurality of windows 320, 322, 324, and 326. Each fixture corresponds to one or more desks, a designated team space, a meeting room, an amenity cluster, or any other feature or group of features potentially found in a structure.

Adjacency evaluator 222 of FIG. 2 is configured to analyze candidate design 300 relative to the preference data 204 associated with a particular potential occupant in order to generate an adjacency metric for the candidate design 300. Adjacency evaluator 222 accumulates a set of shortest path lengths between a position assigned to the potential occupant and any fixtures to which the potential occupant indicated a desired proximity. As shown, adjacency evaluator accumulates the lengths of paths 330, 332, and 334 that traverse between fixture 308 and fixtures 302, 310, and 312, respectively. Adjacency evaluator 222 normalizes the accumulated path lengths based on the number of shortest paths to produce an adjacency metric for the assigned position. The adjacency metric represents a quantity that should be as low as possible in order to provide the potential occupant with the preferred adjacency to specific fixtures.

In one embodiment, adjacency evaluator 222 may perform the above computations for each position that can be assigned to the potential occupant to produce multiple adjacency metrics. Adjacency evaluator 222 may combine all such metrics to produce an overall adjacency metric for candidate design 300 indicating how closely candidate design 300 aligns with the adjacency preferences of that potential occupant. Adjacency evaluator 222 performs similar computations across all potential occupants to generate an overarching adjacency metric for candidate design 300.

Work style evaluator 224 performs a slightly more complex set of computations to generate a work style metric for candidate design 300. In particular, work style evaluator 224 computes four individual metrics, and then combines these metrics together to produce the work style metric. The four metrics include a productivity metric, a circulation metric, a daylight metric, and an outside view metric, as described below in conjunction with FIGS. 4, 5, 6, and 7, respectively.

Exemplary Computation of a Work Style Metric

Figure 4:
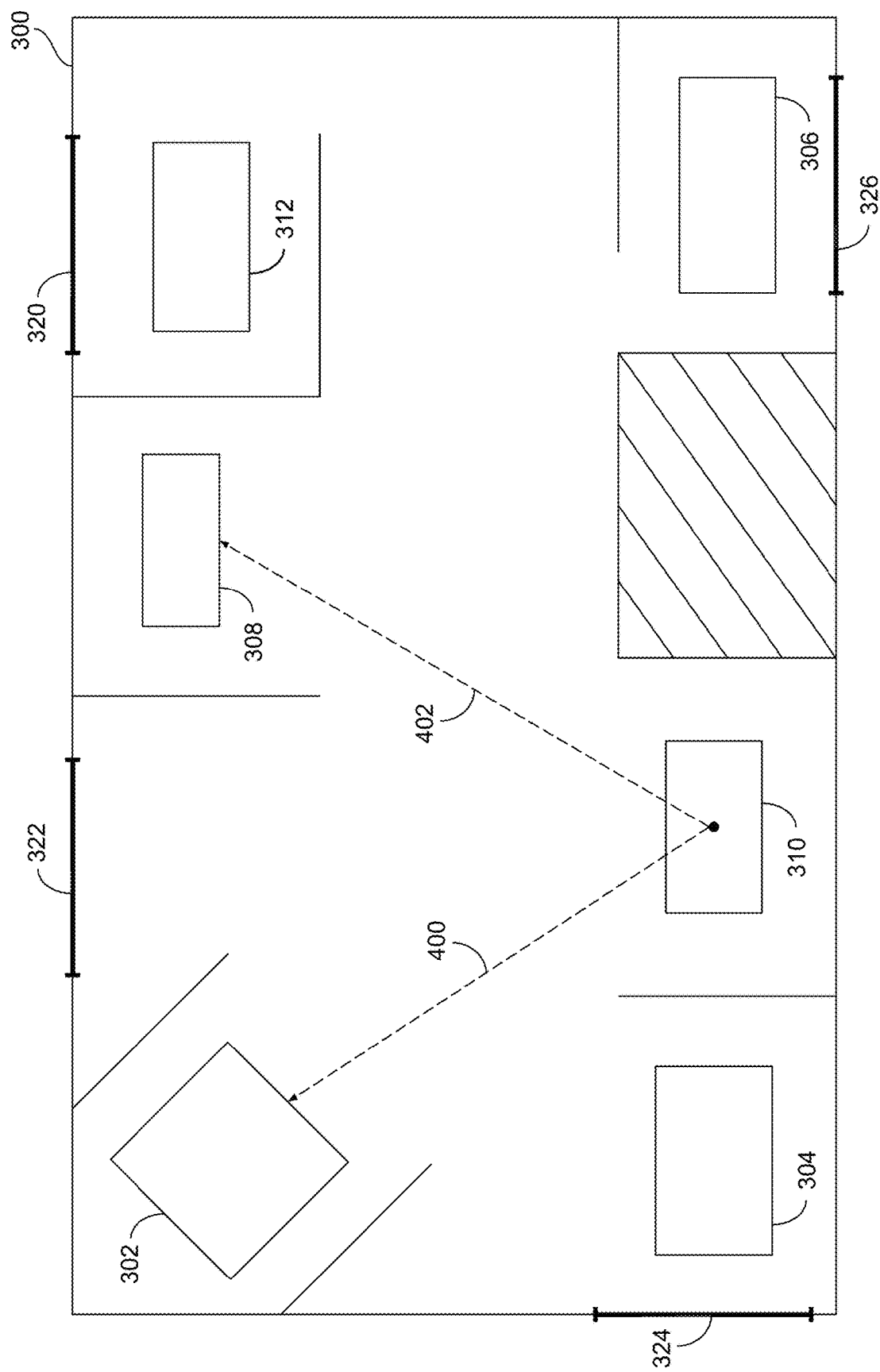
FIG. 4 illustrates how a productivity metric is computed for a candidate design, according to various embodiments of the present invention.

FIG. 4 illustrates how a productivity metric is computed for a candidate design, according to various embodiments of the present invention. As shown, paths 400 and 402 indicate distances between fixture 310 and fixtures 302 and 308, respectively. In this example, fixtures 310, 302, and 308 could be desk clusters associated with different teams. The productivity of a potential occupant who resides at fixture 310 can be estimated based on the distance from fixture 310 to other fixtures where other potential occupants may be performing distracting activities. Accordingly, work style evaluator 224 computes the distances between fixture 310 and any nearby fixtures that reside within the central and/or wide peripheral view of the potential occupant when residing at fixture 310. Work style evaluator 224 combines these distances to generate a productivity metric. The productivity metric contributes to the overall work style metric, as described in greater detail below.

Figure 5:
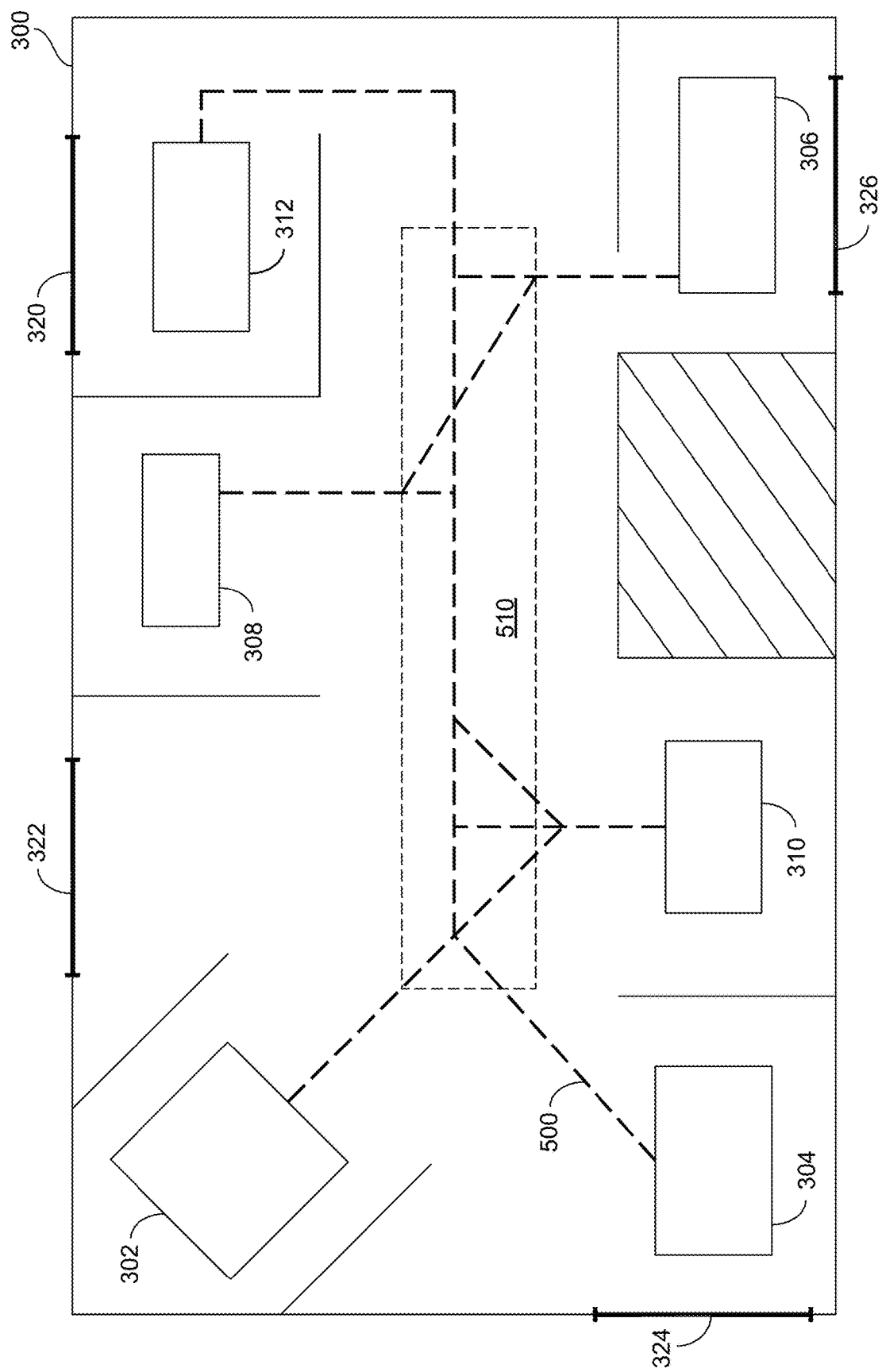
FIG. 5 illustrates how a circulation metric is computed for a candidate design, according to various embodiments of the present invention.

FIG. 5 illustrates how a circulation metric is computed for a candidate design, according to various embodiments of the present invention. As shown, a set of paths 500 traverses between various fixtures within candidate design 300. Paths 500 intersect primarily within a region 510 that resides towards the center of candidate design 300. Work style evaluator 224 computes the number of intersections between paths 500 for multiple locations across candidate design 300. Work style evaluator 224 also computes the length of each path 500. Work style evaluator 224 then combines the number of intersections with the computed path lengths to generate a circulation metric for candidate design 300. In one embodiment, the productivity metric described above is computed at least partially based on the circulation metric. The circulation metric contributes to the overall work style metric, as described in greater detail below.

Figure 6:
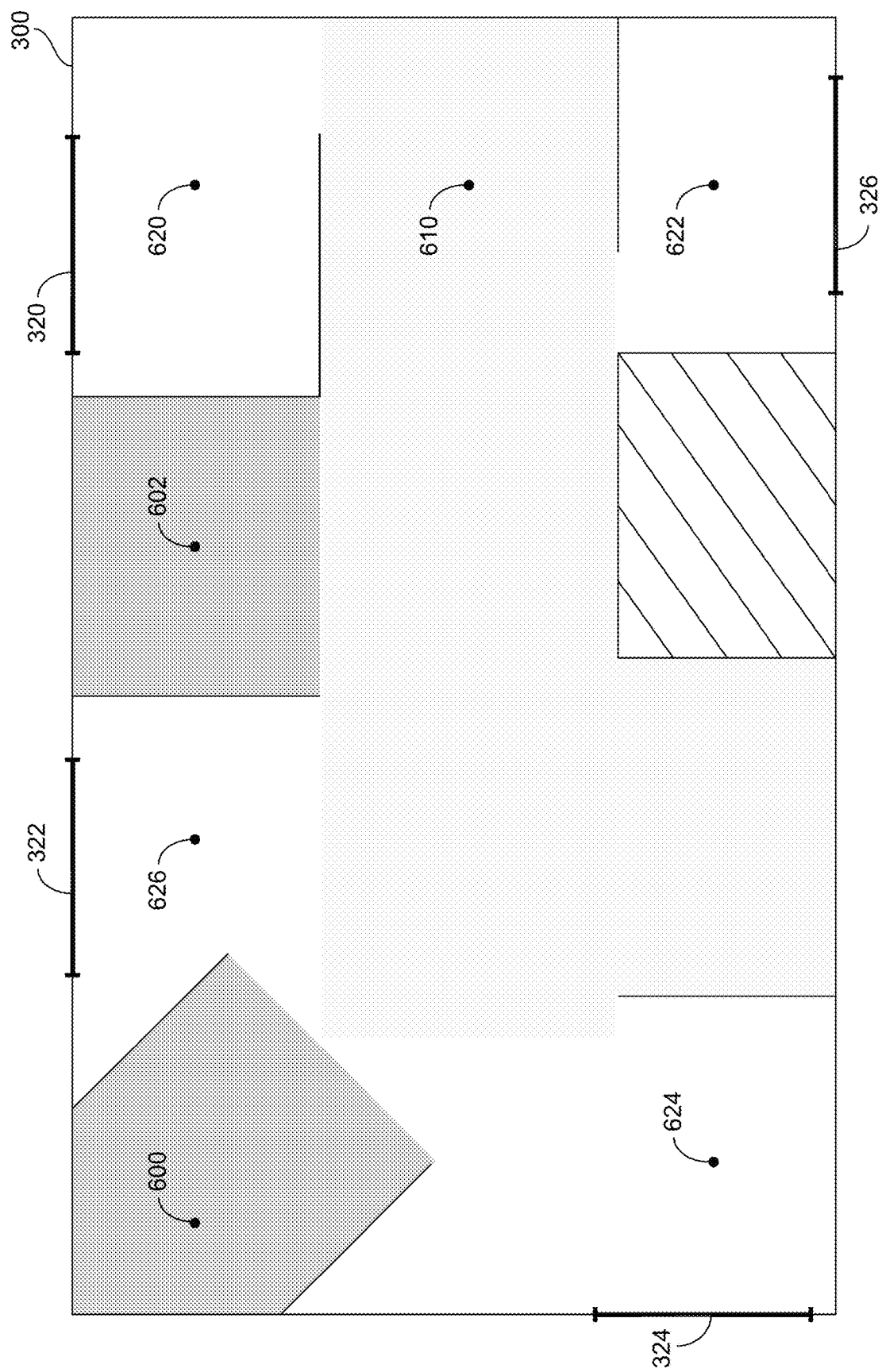
FIG. 6 illustrates how a daylight metric is computed for a candidate design, according to various embodiments of the present invention.

FIG. 6 illustrates how a daylight metric is computed for a candidate design, according to various embodiments of the present invention. As shown, candidate design 300 includes low daylight regions 600 and 602, moderate daylight region 610, and high daylight regions 620, 622, 624, and 626. Work style evaluator 224 implements a daylight simulation program to estimate the daylight levels at each position in candidate design 300 based on the positions of windows 320, 322, 324, and 326. Work style evaluator 224 compares these daylight levels to a minimum recommended daylight level to produce a daylight metric for candidate design 300. The daylight metric contributes to the overall work style metric, as described in greater detail below.

Figure 7:
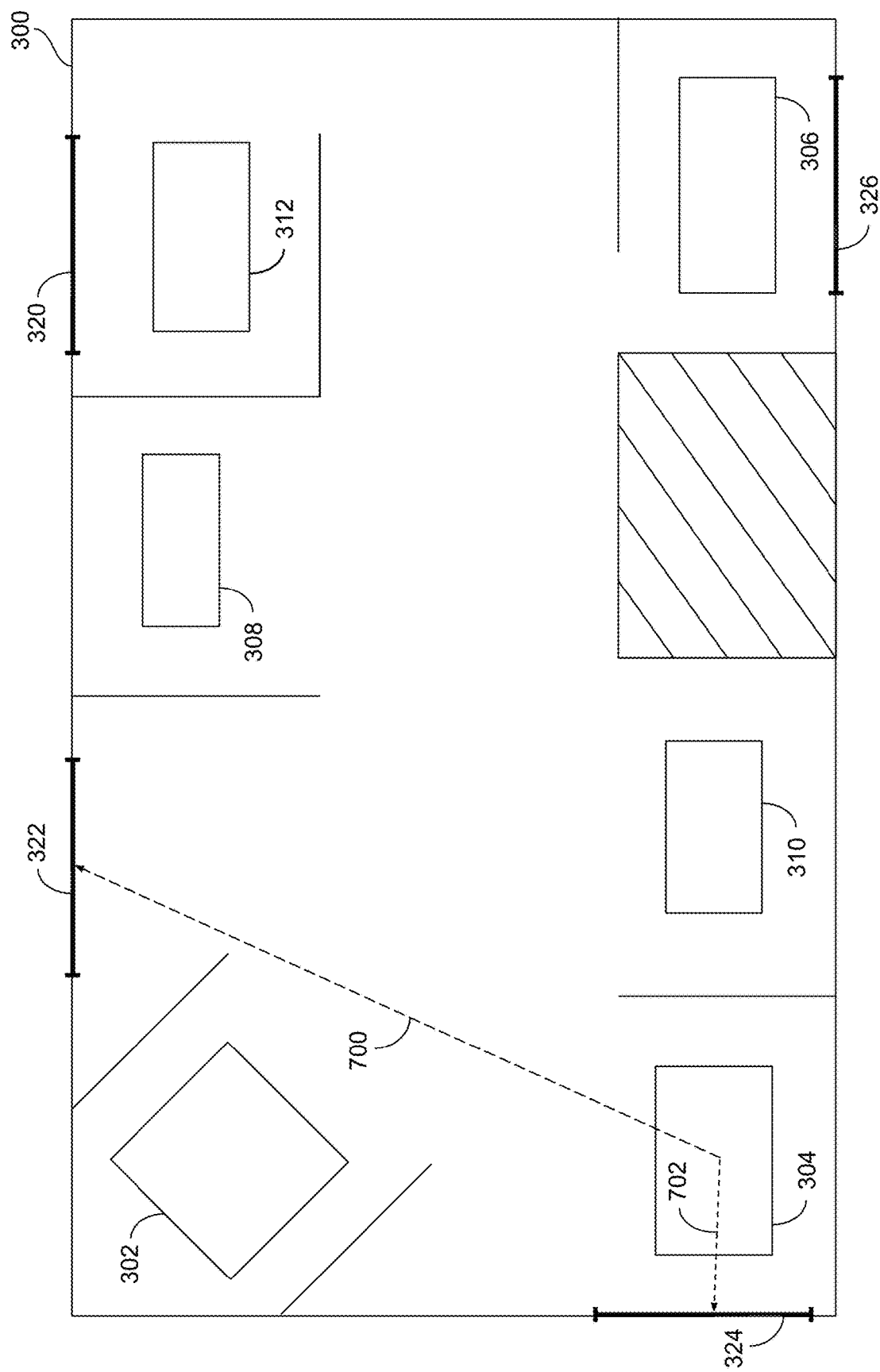
FIG. 7 illustrates how an outside view metric is computed for a candidate design, according to various embodiments of the present invention.

FIG. 7 illustrates how an outside view metric is computed for a candidate design, according to various embodiments of the present invention. As shown, paths 700 and 702 indicate distances between fixture 304 and windows 322 and 324, respectively. Work style evaluator 224 generates paths 700 and 702 to simulate the extent to which a potential occupant residing at fixture 304 can view the outside via a nearby window. Work style evaluator 224 performs this approach for each position in candidate design 300 where a potential occupant can reside, and then combines the distances of these paths to produce an outside view metric for candidate design 300. The outside view metric contributes to the overall work style metric, as described in greater detail below.

Referring generally to FIGS. 4-7, work style evaluator 224 generates the productivity metric, circulation metric, daylight metric, and outside view metric in the manner described above. Work style evaluator 224 then determines, based on the preference data 204 associated with a given potential occupant, how closely candidate design 300 aligns with the preferences of that potential occupant. In doing so, work style evaluator 224 compares each of the above-computed metrics to an associated preference to determine the numerical difference between the metric and the preference. For example, work style evaluator 224 could compare a daylight metric of 3 to a preferred daylight level of 10. Work style evaluator 224 could then determine that a difference of 7 exists between the daylight metric of candidate design 300 and the preferred daylight level stated by the potential occupant.

For a given potential occupant, work style evaluator 224 computes differences for each of the productivity metric, circulation metric, daylight metric, and outside view metric. Work style evaluator 224 then weights these differences according to an importance level indicated by the given potential occupant. The importance levels for each metric could be obtained via surveys 202, for example. Work style evaluator 224 performs similar computations across all potential occupants to generate an overarching work style metric for candidate design 300.

Referring generally to FIGS. 3-7, evaluation module 220 generates an adjacency metric and a work style metric for each candidate design 214 in the manner described relative to exemplary candidate design 300. A given adjacency metric indicates, across all potential occupants, a degree to which an associated candidate design 214 provides the desired level of adjacency. Similarly, a given work style metric indicates, across all potential occupants, a degree to which an associated candidate design 214 provides the desired work style.

Evaluation module 220 combines the adjacency and work style metrics to produce an overall fitness metric for each candidate design 214. A lower fitness metric for a given candidate design 214 indicates that the candidate design 214 aligns closely with the stated preferences of the potential occupants. A higher fitness metric for a given candidate design 214 indicates that the candidate design 214 does not align closely with the stated preferences of the potential occupants. Evaluation module 220 filters candidate designs 214 to produce design options 230 which best address the preferences of all potential occupants.

In one embodiment, evaluation module 220 may perform a calibration routine to improve the accuracy of the above-described metrics. Evaluation module 220 may collect survey data from potential occupants that indicates how closely an existing workspace meets the needs of those potential occupants. Evaluation module 220 may then analyze the geometry of the existing workspace and generate the above metrics for that workspace. Evaluation module 220 compares the generated metrics to the survey data to determine how closely those metrics align with the survey data. Evaluation module 220 then adjusts various weight values associated with the metrics to cause those metrics to more closely align with the survey data.

Procedure for Generating Design Options

Figure 8:
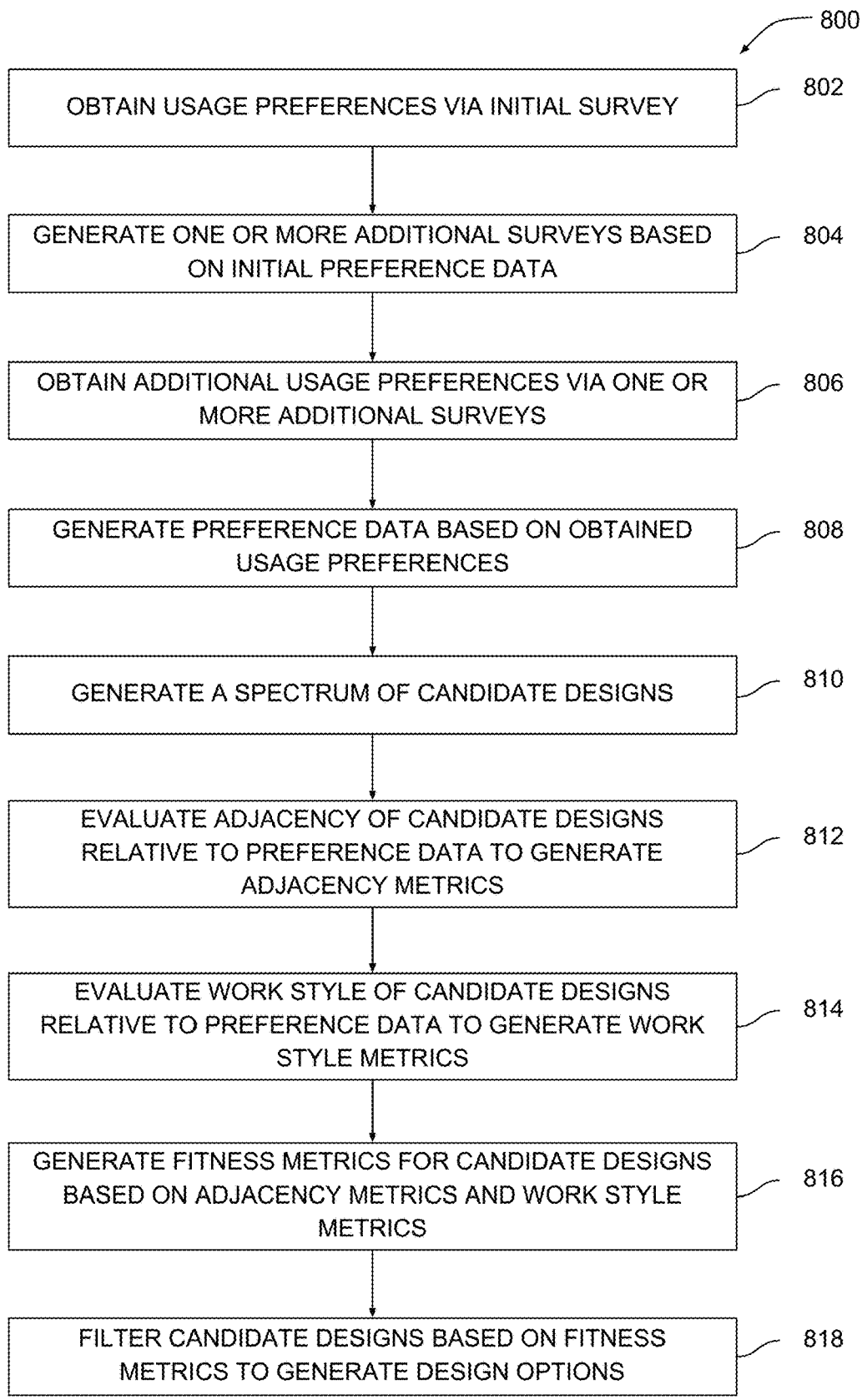
FIG. 8 is a flow diagram of method steps for evaluating candidate designs using simulations of user satisfaction, according to various embodiments of the present invention.

FIG. 8 is a flow diagram of method steps for evaluating candidate designs based on simulations of user satisfaction, according to various embodiments of the present invention. Although the method steps are described in conjunction with the systems of FIGS. 1-7, persons skilled in the art will understand that any system configured to perform the method steps in any order falls within the scope of the present invention.

As shown, a method 800 begins at step 802, where design engine 132 obtains usage preferences via an initial survey. The initial survey could inquire, for example, what high level features potential occupants of a structure deem desirable. Design engine 132 deploys the survey via a web-based interface, in practice. At step 804, design engine 132 generates one or more additional surveys based on initial preference data. Design engine 132 could, for example, determine that all answers to a particular question in the initial survey fall within a specific range. Then, design engine 132 could generate an additional survey that only provides potential occupants with the ability to select within that specific range. Alternatively, design engine 132 could include a general query in the initial survey, and then include a specific query in the one or more additional queries related to the most popular answer to the general query.

At step 806, design engine 132 obtains additional usage preferences via the one or more additional surveys. Design engine 132 may repeat step 806 depending on the number of additionally generated surveys. At step 808, design engine 132 generates preference data based on the obtained usage preferences. The preference data is a structured data set that quantifies the preferences of each potential occupant.

At step 810, design engine 132 generates a spectrum of candidate designs. Design engine 132 implements a generative design process to create multiple candidate designs that meet various design criteria. In one embodiment, design engine 132 sequentially applies a set of geometry construction rules using varying sets of parameters to produce different candidate designs.

At step 812, design engine 132 evaluates the adjacency of candidate designs relative to the generated preference data to generate adjacency metrics for each potential occupant. A given adjacency metric associated with a particular candidate design and potential occupant indicates how closely that candidate design aligns with the adjacency preferences of the potential occupant. Those preferences include adjacency to other team members and adjacency to amenities. Design engine 132 combines all such metrics to produce an overarching adjacency metric for each candidate design. Design engine 132 implements the approach described by way of example in conjunction with FIG. 3 to produce the adjacency metric.

At step 814, design engine 132 evaluates the work style of the candidate designs relative to the generated preference data to generate work style metrics for each potential occupant. A given work style metric associated with a particular candidate design and potential occupant indicates how closely that candidate design aligns with the work style preferences of the potential occupant. The work style metric is generated based on a productivity metric, a circulation metric, a daylight metric, and an outside view metric, as described above in conjunction with FIGS. 4-7. Design engine 132 combines these metrics to produce an overarching work style metric for each candidate design.

At step 816, design engine 132 generates a fitness metric for each candidate design based on the associated adjacency metrics and work style metrics. The fitness metric for a given candidate design indicates how closely that design meets the needs of the potential occupants. In one embodiment, design engine 132 may omit step 816 and not generate the fitness metric. Instead, design engine 132 may evaluate each candidate design 214 based directly on the adjacency and work style metrics without first combining these metrics. At step 818, design engine 132 filters the candidate designs based on the fitness metrics to generate design options. The design options include those candidate designs with fitness metrics indicating that the preferences of the potential occupants are well-met. In one embodiment, design engine 132 discards all candidate designs with a fitness score that falls outside of a specified range.

In sum, a design engine is configured to interact with potential occupants of a structure to generate data that defines the usage preferences of those occupants. The design engine generates multiple candidate designs for the structure via a generative design process, and then evaluates each candidate design using a set of metrics determined relative to the usage preferences. Based on these evaluations, the design engine selects at least one candidate design that optimizes the set of metrics across all potential occupants.

At least one advantage of the disclosed approach is that candidate designs for a structure can be automatically and objectively evaluated to determine specific designs which address the needs of potential occupants of the structure. In particular, candidate designs can be objectively evaluated via a computer-based analysis that involves various metrics. The various metrics are defined mathematically and automatically generated based on the geometry of the candidate designs to represent the subjective needs and constraints of the potential occupants. Therefore, the computer-based analysis of these metrics enables the quantification and objective evaluation of those subjective needs and constraints. Accordingly, the disclosed approach represents an advancement over prior art techniques that provide no objective metrics for selecting candidate designs and no techniques for addressing subjective needs of potential occupants.

1. Some embodiments include a computer-implemented method for generating an architectural design for a structure, the method comprising generating preference data that indicates a set of preferences associated with a first potential occupant of the structure, wherein the preference data indicates at least one numerical value corresponding to a first attribute of the structure, generating a plurality of candidate designs for the structure via a generative design process, wherein each candidate design included in the plurality of candidate designs satisfies each design criterion included in a set of design criteria, generating a first set of metrics for a first candidate design included in the plurality of candidate designs based on the preference data and one or more geometrical analyses of the first candidate design, and generating a fitness metric for the first candidate design based on the first set of metrics, wherein the fitness metric indicates that the first candidate design meets the set of preferences to a greater degree than any other candidate design included in the plurality of candidate designs.

2. The computer-implemented method of clause 1, wherein generating the first set of metrics for the first candidate design comprises generating a first metric for the first candidate design based on a first geometrical analysis of the first candidate design, wherein the first metric indicates a degree to which the first candidate design meets an adjacency preference associated with the first potential occupant, and generating a second metric for the first candidate design based on a second geometrical analysis of the first candidate design, wherein the second metric indicates a degree to which the first candidate design meets one or more work style preferences associated with the first potential occupant.

3. The computer-implemented method of any of clauses 1-2, wherein generating the first metric for the first candidate design comprises identifying a first fixture included in the first candidate design based on the preference data, and computing a first distance between a first position included in the first candidate design and the first fixture.

4. The computer-implemented method of any of clauses 1-3, wherein generating the second metric for the first candidate design comprises identifying a first fixture included in the first candidate design that is visible from a first position included in the first candidate design, and computing a first distance between the first position and the first fixture.

5. The computer-implemented method of any of clauses 1-4, wherein generating the second metric for the first candidate design comprises determining a first set of paths that traverse a first position included in the first candidate design, and determining a number of paths included in the first set of paths.

6. The computer-implemented method of any of clauses 1-5, wherein generating the second metric for the first candidate design comprises determining an estimated daylight level for each position included in a plurality of positions included in the first candidate design, and computing an average daylight level across the plurality of positions.

7. The computer-implemented method of any of clauses 1-6, wherein generating the second metric for the first candidate design comprises identifying a first window included in the first candidate design that is visible from a first position included in the first candidate design, and computing a first distance between the first position and the first window.

8. The computer-implemented method of any of clauses 1-7, wherein generating the preference data comprises generating a first survey that includes a first set of queries related to one or more attributes of the structure, determining a first set of responses to the first set of queries based on a first interaction with the first potential occupant, generating a second survey that includes a second set of queries related to the one or more attributes of the structure based on the first set of responses, and determining a second set of responses to the second set of queries based on a second interaction with the first potential occupant, wherein each response included in the second set of responses comprises a numerical value.

9. The computer-implemented method of any of clauses 1-8, wherein generating the plurality of candidate designs for the structure comprises executing a set of geometrical construction rules for each candidate design included in the plurality of candidate designs based on a different set of construction parameters.

10. The computer-implemented method of any of clauses 1-9, wherein at least one design criterion included in the set of design criteria comprises a design constraint or a design objective.

11. Some embodiments include a non-transitory computer-readable medium storing program instructions that, when executed by a processor, cause the processor to generate an architectural design for a structure by performing the steps of generating preference data that indicates a set of preferences associated with a first potential occupant of the structure, wherein the preference data indicates at least one numerical value corresponding to a first attribute of the structure, generating a plurality of candidate designs for the structure via a generative design process, wherein each candidate design included in the plurality of candidate designs satisfies each design criterion included in a set of design criteria, generating a first set of metrics for a first candidate design included in the plurality of candidate designs based on the preference data and one or more geometrical analyses of the first candidate design, and generating a fitness metric for the first candidate design based on the first set of metrics, wherein the fitness metric indicates that the first candidate design meets the set of preferences to a greater degree than any other candidate design included in the plurality of candidate designs.

12. The non-transitory computer-readable medium of clause 11, wherein at least one metric included in the first set of metrics is generated by identifying a first fixture included in the first candidate design based on the preference data, and computing a first distance between a first position included in the first candidate design and the first fixture.

13. The non-transitory computer-readable medium of any of clauses 11-12, wherein at least one metric included in the first set of metrics is generated by identifying a first fixture included in the first candidate design that is visible from a first position included in the first candidate design, and computing a first distance between the first position and the first fixture.

14. The non-transitory computer-readable medium of any of clauses 11-13, wherein at least one metric included in the first set of metrics is generated by determining a first set of paths that traverse a first position included in the first candidate design, and determining a number of paths included in the first set of paths.

15. The non-transitory computer-readable medium of any of clauses 11-14, wherein at least one metric included in the first set of metrics is generated by determining an estimated daylight level for each position included in a plurality of positions included in the first candidate design, and computing an average daylight level across the plurality of positions.

16. The non-transitory computer-readable medium of any of clauses 11-15, wherein at least one metric included in the first set of metrics is generated by identifying a first window included in the first candidate design that is visible from a first position included in the first candidate design, and computing a first distance between the first position and the first window.

17. The non-transitory computer-readable medium of any of clauses 11-16, wherein the step of generating the plurality of candidate designs for the structure comprises executing a set of geometrical construction rules for each candidate design included in the plurality of candidate designs based on a different set of construction parameters.

18. The non-transitory computer-readable medium of any of clauses 11-17, wherein the step of generating the fitness metric for the first candidate design comprises computing a weighted sum of a subset of metrics included in the first set of metrics.

19. The non-transitory computer-readable medium of any of clauses 11-18, further comprising the steps of generating calibration data based on a first interaction with the first potential occupant and a geometrical analysis of an existing structure associated with the potential occupant, and adjusting the fitness metric generated for the first candidate design based on the calibration data.

20. Some embodiments include a computing device, comprising a memory storing a design engine, and a processor that, when executing the design engine, is configured to perform the steps of generating preference data that indicates a set of preferences associated with a first potential occupant of the structure, wherein the preference data indicates at least one numerical value corresponding to a first attribute of the structure, generating a plurality of candidate designs for the structure via a generative design process, wherein each candidate design included in the plurality of candidate designs satisfies each design criterion included in a set of design criteria, generating a first set of metrics for a first candidate design included in the plurality of candidate designs based on the preference data and one or more geometrical analyses of the first candidate design, and generating a fitness metric for the first candidate design based on the first set of metrics, wherein the fitness metric indicates that the first candidate design meets the set of preferences to a greater degree than any other candidate design included in the plurality of candidate designs.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for generating an architectural design for a structure, the method comprising:
   generating preference data that indicates a set of preferences associated with a first potential occupant of the structure, wherein the preference data indicates at least one numerical value corresponding to a first attribute of the structure;
   generating a plurality of candidate designs for the structure via a generative design process, wherein each candidate design included in the plurality of candidate designs comprises a geometric model that satisfies each design criterion included in a set of design criteria, and wherein the generative design process is executed via a geometrical construction algorithm that sequentially applies a set of geometrical construction rules to produce the plurality of candidate designs;
   generating a first set of metrics for a first candidate design included in the plurality of candidate designs based on the preference data and one or more geometrical analyses of the first candidate design;
   generating a fitness metric for the first candidate design based on the first set of metrics, wherein the fitness metric indicates that the first candidate design meets the set of preferences to a greater degree than any other candidate design included in the plurality of candidate designs; and
   filtering the plurality of candidate designs based on the fitness metric to generate one or more design options that comprise one or more geometric models outlining one or more potential layouts of the structure.

2. The computer-implemented method of claim 1, wherein generating the first set of metrics for the first candidate design comprises:
   generating a first metric for the first candidate design based on a first geometrical analysis of the first candidate design, wherein the first metric indicates a degree to which the first candidate design meets an adjacency preference associated with the first potential occupant; and generating a second metric for the first candidate design based on a second geometrical analysis of the first candidate design, wherein the second metric indicates a degree to which the first candidate design meets one or more work style preferences associated with the first potential occupant.

3. The computer-implemented method of claim 2, wherein generating the first metric for the first candidate design comprises:
   identifying a first fixture included in the first candidate design based on the preference data; and
   computing a first distance between a first position included in the first candidate design and the first fixture.

4. The computer-implemented method of claim 2, wherein generating the second metric for the first candidate design comprises:
   identifying a first fixture included in the first candidate design that is visible from a first position included in the first candidate design; and
   computing a first distance between the first position and the first fixture.

5. The computer-implemented method of claim 2, wherein generating the second metric for the first candidate design comprises:
   determining a first set of paths that traverse a first position included in the first candidate design; and
   determining a number of paths included in the first set of paths.

6. The computer-implemented method of claim 2, wherein generating the second metric for the first candidate design comprises:
   determining an estimated daylight level for each position included in a plurality of positions included in the first candidate design; and
   computing an average daylight level across the plurality of positions.

7. The computer-implemented method of claim 2, wherein generating the second metric for the first candidate design comprises:
   identifying a first window included in the first candidate design that is visible from a first position included in the first candidate design; and
   computing a first distance between the first position and the first window.

8. The computer-implemented method of claim 1, wherein generating the preference data comprises:
   generating a first survey that includes a first set of queries related to one or more attributes of the structure;
   determining a first set of responses to the first set of queries based on a first interaction with the first potential occupant;
   generating a second survey that includes a second set of queries related to the one or more attributes of the structure based on the first set of responses; and
   determining a second set of responses to the second set of queries based on a second interaction with the first potential occupant, wherein each response included in the second set of responses comprises a numerical value.

9. The computer-implemented method of claim 1, wherein the geometrical construction algorithm sequentially applies the set of geometrical construction rules using different sets of construction parameters to produce different candidate designs included in the plurality of candidate designs.

10. The computer-implemented method of claim 1, wherein at least one design criterion included in the set of design criteria comprises a design constraint or a design objective.

11. A non-transitory computer-readable medium storing program instructions that, when executed by a processor, cause the processor to generate an architectural design for a structure by performing the steps of:
    generating preference data that indicates a set of preferences associated with a first potential occupant of the structure, wherein the preference data indicates at least one numerical value corresponding to a first attribute of the structure;
    generating a plurality of candidate designs for the structure via a generative design process, wherein each candidate design included in the plurality of candidate designs comprises a geometric model that satisfies each design criterion included in a set of design criteria, and wherein the generative design process is executed via a geometrical construction algorithm that sequentially applies a set of geometrical construction rules to produce the plurality of candidate designs;
    generating a first set of metrics for a first candidate design included in the plurality of candidate designs based on the preference data and one or more geometrical analyses of the first candidate design; and
    generating a fitness metric for the first candidate design based on the first set of metrics, wherein the fitness metric indicates that the first candidate design meets the set of preferences to a greater degree than any other candidate design included in the plurality of candidate designs; and
    filtering the plurality of candidate designs based on the fitness metric to generate one or more design options that comprise one or more geometric models outlining one or more potential layouts of the structure.

12. The non-transitory computer-readable medium of claim 11, wherein at least one metric included in the first set of metrics is generated by:
    identifying a first fixture included in the first candidate design based on the preference data; and
    computing a first distance between a first position included in the first candidate design and the first fixture.

13. The non-transitory computer-readable medium of claim 11, wherein at least one metric included in the first set of metrics is generated by:
    identifying a first fixture included in the first candidate design that is visible from a first position included in the first candidate design; and
    computing a first distance between the first position and the first fixture.

14. The non-transitory computer-readable medium of claim 11, wherein at least one metric included in the first set of metrics is generated by:
    determining a first set of paths that traverse a first position included in the first candidate design; and
    determining a number of paths included in the first set of paths.

15. The non-transitory computer-readable medium of claim 11, wherein at least one metric included in the first set of metrics is generated by:
    determining an estimated daylight level for each position included in a plurality of positions included in the first candidate design; and
    computing an average daylight level across the plurality of positions.

16. The non-transitory computer-readable medium of claim 11, wherein at least one metric included in the first set of metrics is generated by:
- identifying a first window included in the first candidate design that is visible from a first position included in the first candidate design; and
- computing a first distance between the first position and the first window.

17. The non-transitory computer-readable medium of claim 11, wherein the geometrical construction algorithm sequentially applies the set of geometrical construction rules using different sets of construction parameters to produce different candidate designs included in the plurality of candidate designs.

18. The non-transitory computer-readable medium of claim 11, wherein the step of generating the fitness metric for the first candidate design comprises computing a weighted sum of a subset of metrics included in the first set of metrics.

19. The non-transitory computer-readable medium of claim 11, further comprising the steps of:
- generating calibration data based on a first interaction with the first potential occupant and a geometrical analysis of an existing structure associated with the first potential occupant; and
- adjusting the fitness metric generated for the first candidate design based on the calibration data.

20. A computing device, comprising:
a memory storing a design engine; and
a processor that, when executing the design engine, is configured to perform the steps of:
- generating preference data that indicates a set of preferences associated with a first potential occupant of a structure, wherein the preference data indicates at least one numerical value corresponding to a first attribute of the structure,
- generating a plurality of candidate designs for the structure via a generative design process, wherein each candidate design included in the plurality of candidate designs comprises a geometric model that satisfies each design criterion included in a set of design criteria, and wherein the generative design process is executed via a geometrical construction algorithm that sequentially applies a set of geometrical construction rules to produce the plurality of candidate designs,
- generating a first set of metrics for a first candidate design included in the plurality of candidate designs based on the preference data and one or more geometrical analyses of the first candidate design, and
- generating a fitness metric for the first candidate design based on the first set of metrics, wherein the fitness metric indicates that the first candidate design meets the set of preferences to a greater degree than any other candidate design included in the plurality of candidate designs; and
- filtering the plurality of candidate designs based on the fitness metric to generate one or more design options that comprise one or more geometric models outlining one or more potential layouts of the structure.

* * * * *

UNITED STATES PATENT AND TRADEMARK OFFICE
CERTIFICATE OF CORRECTION

PATENT NO. : 11,423,191 B2  
APPLICATION NO. : 16/112562  
DATED : August 23, 2022  
INVENTOR(S) : James Stoddart et al.

Page 1 of 1

It is certified that error appears in the above-identified patent and that said Letters Patent is hereby corrected as shown below:

On the Title Page

Item [56], delete "Naber et al., "Workspaces that Move People", Harvard Business Review, vol. 92, No. 10, Oct. 2014, pp. 68-77." and insert --Waber et al., "Workspaces that Move People", Harvard Business Review, vol. 92, No. 10, Oct. 2014, pp. 68-77.--.

Signed and Sealed this  
Twenty-second Day of November, 2022

Katherine Kelly Vidal  
*Director of the United States Patent and Trademark Office*